(12) United States Patent
Matsui et al.

(10) Patent No.: US 8,908,302 B2
(45) Date of Patent: Dec. 9, 2014

(54) EXPOSURE METHOD FOR COLOR FILTER SUBSTRATE

(75) Inventors: Kohei Matsui, Tokyo (JP); Ryosuke Yasui, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 189 days.

(21) Appl. No.: 13/521,963

(22) PCT Filed: Jan. 7, 2011

(86) PCT No.: PCT/JP2011/000049
§ 371 (c)(1),
(2), (4) Date: Jul. 12, 2012

(87) PCT Pub. No.: WO2011/086882
PCT Pub. Date: Jul. 21, 2011

(65) Prior Publication Data
US 2012/0287525 A1    Nov. 15, 2012

(30) Foreign Application Priority Data

Jan. 18, 2010    (JP) .................................. 2010-008534

(51) Int. Cl.
*G02B 5/22* (2006.01)
*G02B 7/00* (2006.01)
*G02F 1/1339* (2006.01)
*G02F 1/1335* (2006.01)
*G03F 7/00* (2006.01)
*G03F 7/20* (2006.01)
*G02B 5/20* (2006.01)
*G02F 1/1333* (2006.01)

(52) U.S. Cl.
CPC ...... *G02F 1/13394* (2013.01); *G02F 1/133516* (2013.01); *G03F 7/0007* (2013.01); *G03F 7/203* (2013.01); *G03F 7/70466* (2013.01); *G03F 7/70791* (2013.01); *G02B 5/201* (2013.01); *G02F 2001/133388* (2013.01)
USPC .......................................... 359/891; 359/892

(58) Field of Classification Search
None
See application file for complete search history.

(56) References Cited

FOREIGN PATENT DOCUMENTS

| CN | 2715192 Y | 8/2005 |
|---|---|---|
| CN | 101609227 A | 12/2009 |
| JP | 2001-249462 | 9/2001 |
| JP | 2006-292955 | 10/2006 |
| JP | 2007-121344 | 5/2007 |
| JP | 2007-240711 | 9/2007 |

(Continued)

OTHER PUBLICATIONS

Japanese Office Action mailed Dec. 19, 2013 in corresponding Japanese Application No. 2010-008534.

(Continued)

*Primary Examiner* — Jade R Chwasz

(57) ABSTRACT

An exposure method for color filter substrate is provided. As shown in FIG. 7(*a*), exposure is performed while a substrate 20 to which a photoresist has been applied is being transported in the Y direction, to simultaneously form first layers 81 and layers 91 in first non-display regions 51 (regions indicated by hatching sloping upward to the right) and the display region, respectively, on the substrate 20. Next, as shown in (b), the substrate 20 is rotated by 90 degrees, and exposure is performed while the substrate 20 is being transported in the X direction, to form second layers 82 in second non-display regions 52 (regions indicated by hatching sloping upward to the right). Thus, dummy PSs 71 and dummy PSs 72 arranged with desired pitches and having desired shapes can be formed in the first non-display regions 51 and the second non-display regions 52, respectively.

2 Claims, 9 Drawing Sheets

(56) References Cited

FOREIGN PATENT DOCUMENTS

| JP | 2007-281317 | 10/2007 |
| JP | 2008-158138 | 7/2008 |
| JP | 2009-116068 | 5/2009 |
| WO | WO 00/11707 | 3/2000 |
| WO | WO 2010/125823 | 11/2010 |

OTHER PUBLICATIONS

Machine Translation of JP 2009-116068 (Ref. AE in the IDS filed Jul. 12, 2012).
International Search Report of corresponding PCT/JP2011/000049 mailed Mar. 8, 2011.
Chinese Office Action mailed Mar. 14, 2014 in corresponding Chinese Application No. 201180005708.0.
Machine Translation of JP 2001-249462 (Ref. AG in the IDS filed Jul. 12, 2012).

US 8,908,302 B2

EXPOSURE METHOD FOR COLOR FILTER SUBSTRATE

CROSS-REFERENCE TO RELATED APPLICATIONS

This application is a U.S. National Phase application of PCT/JP2011/000049 filed Jan. 7, 2011 and claims the priority benefit of Japanese Application No. 2010-008534 filed Jan. 18, 2010 in the Japanese Intellectual Property Office, the contents of both of which are incorporated herein by reference.

TECHNICAL FIELD

The present invention relates to an exposure method for a color filter substrate used for liquid crystal display devices and the like.

BACKGROUND ART

With recent increase in the size of liquid crystal display devices, the size of color filters used for liquid crystal display devices has also increased. In a process of producing color filters, patterning is performed by photolithography to form colored layers. However, there is a problem that the cost of producing color filters is increased due to the very high price of large photomasks. In response, various kinds of new exposure methods using small masks have been studied.

One example of the exposure methods using small masks is a method (hereinafter, referred to as a "small mask continuous exposure mode") in which the entire surface of a to-be-exposed substrate is repeatedly exposed while the substrate is being transported, by using an exposure device in which photomasks smaller than the substrate are mounted to exposure heads.

FIG. 10 is a plan view illustrating an exposure method employing the small mask continuous exposure mode, and FIG. 11 is a side view illustrating a positional relationship among a substrate, a photomask, and a blind shutter.

As shown in FIG. 10, a photomask 130 is located relative to a substrate 120. The photomask includes, for example, a plurality of openings 131 for forming dot-shaped colored pixels and photo spacers (hereinafter, also referred to as "PSs"). While the substrate 120 is being transported in a direction indicated by an arrow in FIG. 10, display regions of the substrate 120 are sequentially exposed through the openings 131 to form colored pixels and photo spacers (not shown).

The substrate 120 has display regions 140 in which colored pixels are formed and non-display regions 150 surrounding the circumferences of the display regions 140. The PSs formed in each display region 140 function to maintain a constant interval between a color filter substrate 110 and a TFT substrate which is an opposite substrate when the two substrates are bonded together. The PSs are provided also in each non-display region 150 in some cases (PSs provided in each non-display region 150 are referred to as "dummy PSs" hereinafter). When the color filter substrate 110 and the TFT substrate are bonded together, the dummy PSs serve an important function of maintaining a constant interval between the two substrates at the outside of the display region 140, and thus stabilizing a cell gap (a space containing liquid crystals in a cell).

CITATION LIST

Patent Literature

[Patent Literature 1] Japanese Laid-Open Patent Publication No. 2006-292955

SUMMARY

In general, not all parts in a color filter substrate are provided with PSs (including dummy PSs), and some parts have a region in which no dummy PS is formed, so as to avoid contact with TFT lines and not to obstruct cutting out of the substrate. The region in which no dummy PS is formed acts as a factor of deflection of the color filter substrate when the substrate is bonded to a TFT substrate. At the time of bonding, different stresses are applied to a display region and its surrounding region. Therefore, the arrangement density, the size, and the height of dummy PSs are adjusted separately from those of PSs provided in the display region in accordance with the distribution of stress occurring when the color filter substrate and the TFT substrate are bonded together. In addition, the dummy PSs are arranged in a non-display region with irregular pitches in order to avoid interference with an alignment mark or the like which is necessary for the production process of the color filter substrate.

In the small mask continuous exposure mode described above, however, since the same patterns are repeatedly burned along the substrate transportation direction, the shape of the patterns and the arrangement pitch of the patterns cannot be changed during the exposure. Furthermore, as shown in FIG. 10, a plurality of color filter substrates 110 are formed on a single substrate 120 by exposure, and at this time, portions sandwiched between the display regions 140 aligned in the substrate transportation direction are not exposed through the same photomasks as used for exposure of the display regions 140. Accordingly, as shown in FIG. 11, blind shutters 139 that move in synchronization with the substrate are provided to shade regions between the display regions 140. This causes a problem that dummy PSs cannot be formed by exposure in portions of the non-display regions 150 that are along the sides orthogonal to the substrate transportation direction.

Therefore, an object of the present invention is to provide an exposure method that can efficiently form dummy PSs in a non-display region outside a display region on a color filter substrate by using the small mask continuous exposure mode.

The present invention relates to an exposure method for a color filter substrate including: a rectangular display region which has a pair of sides extending in a first direction and a pair of sides extending in a second direction orthogonal to the first direction and in which a plurality of colored pixels and a plurality of photo spacers (PSs) are provided; a pair of first non-display regions which are respectively along the sides extending in the first direction and in which a plurality of dummy photo spacers (dummy PSs) are provided; and a pair of second non-display regions which are respectively along the sides extending in the second direction and in which a plurality of dummy photo spacers (dummy PSs) are provided.

The exposure method for the color filter substrate according to the present invention includes the steps of: forming a first layer included in a first dummy PS in the first non-display region by intermittently performing exposure a plurality of times on a substrate to which a photoresist has been applied while transporting the substrate in the first direction; and forming a second layer included in a second dummy PS in the second non-display region by intermittently performing exposure a plurality of times on the substrate to which the photoresist has been applied while transporting the substrate in the second direction. The step of forming the first layer and the step of forming the second layer are carried out in an arbitrary order. The first layer and the second layer are composed of a material different from a material of the colored pixels.

Another exposure method for a color filter substrate according to the present invention includes the steps of: forming a colored pixel of a first color in a display region, and forming, in a first non-display region, a first layer included in a first dummy PS and composed of the same material as the colored pixel of the first color, by intermittently performing exposure a plurality of times on a substrate to which a photoresist of the first color has been applied while transporting the substrate in the first direction; forming a colored pixel of a second color in the display region, and forming, in a second non-display region, a second layer included in a second dummy PS and composed of the same material as the colored pixel of the second color, by intermittently performing exposure a plurality of times on the substrate to which a photoresist of the second color has been applied while transporting the substrate in the second direction; forming a colored pixel of a third color in the display region by intermittently performing exposure a plurality of times on the substrate to which a photoresist of the third color has been applied while transporting the substrate in the first direction or the second direction; and forming a third layer included in the first dummy PS over the first layer in the first non-display region, and forming a fourth layer included in the second dummy PS over the second layer in the second non-display region, by performing exposure once on the substrate to which a photoresist has been applied. The step of forming the colored pixel of the first color and the first layer, the step of forming the colored pixel of the second color and the second layer, and the step of forming the colored pixel of the third color, are carried out in an arbitrary order. The third and fourth layers are composed of a material different from a material of the colored pixels.

The present invention also relates to a color filter substrate including: a rectangular display region which has a pair of sides extending in a first direction and a pair of sides extending in a second direction orthogonal to the first direction; a pair of first non-display regions which are respectively along the sides extending in the first direction; and a pair of second non-display regions which are respectively along the sides extending in the second direction.

The color filter substrate according to the present invention includes: a plurality of colored pixels provided in the display region; a plurality of photo spacers provided in the display region; a first dummy photo spacer including a first layer formed in the first non-display region and composed of a material different from a material of the colored pixels; and a second dummy photo spacer including a second layer formed in the second non-display region and composed of a material different from the material of the colored pixels.

Another color filter substrate according to the present invention includes: a colored pixel formed in a display region; a photo spacer formed in the display region; a first dummy photo spacer including a first layer provided in a first non-display region and composed of the same material as the colored pixel of a first color, and a third layer stacked over the first layer and composed of a material different from that of the colored pixel; and a second dummy photo spacer including a second layer provided in a second non-display region and composed of the same material as the colored pixel of a second color, and a fourth layer stacked over the second layer and composed of a material different from that of the colored pixel.

According to the present invention, dummy PSs can be formed in the entire non-display region located outside the four sides of a display region of a color filter substrate by performing exposure using the small mask continuous exposure mode.

DESCRIPTION OF EMBODIMENTS (Basic Structure)

Figure 1:
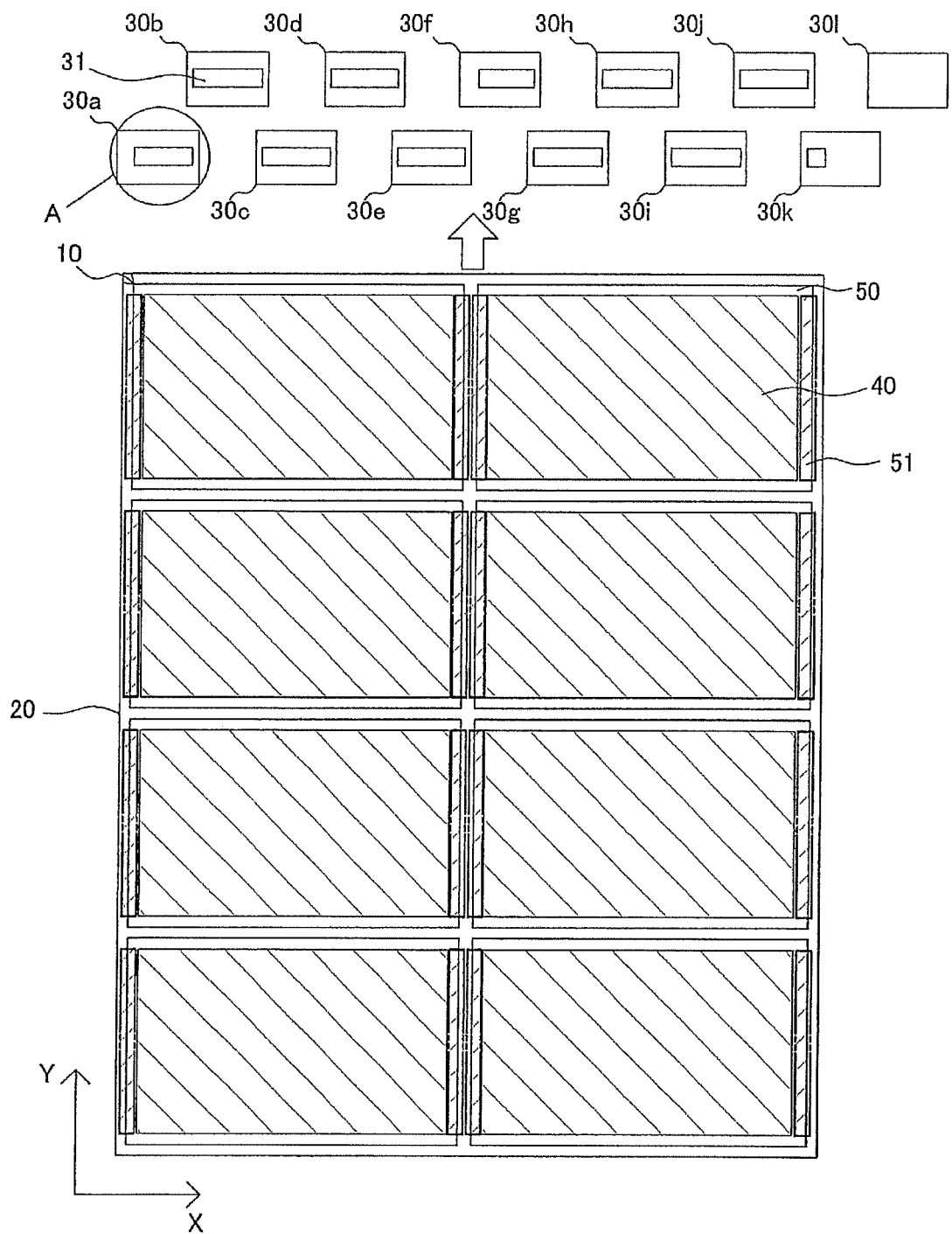
FIG. 1 is a plan view illustrating a basic exposure method common to all embodiments of the present invention.
Figure 2:
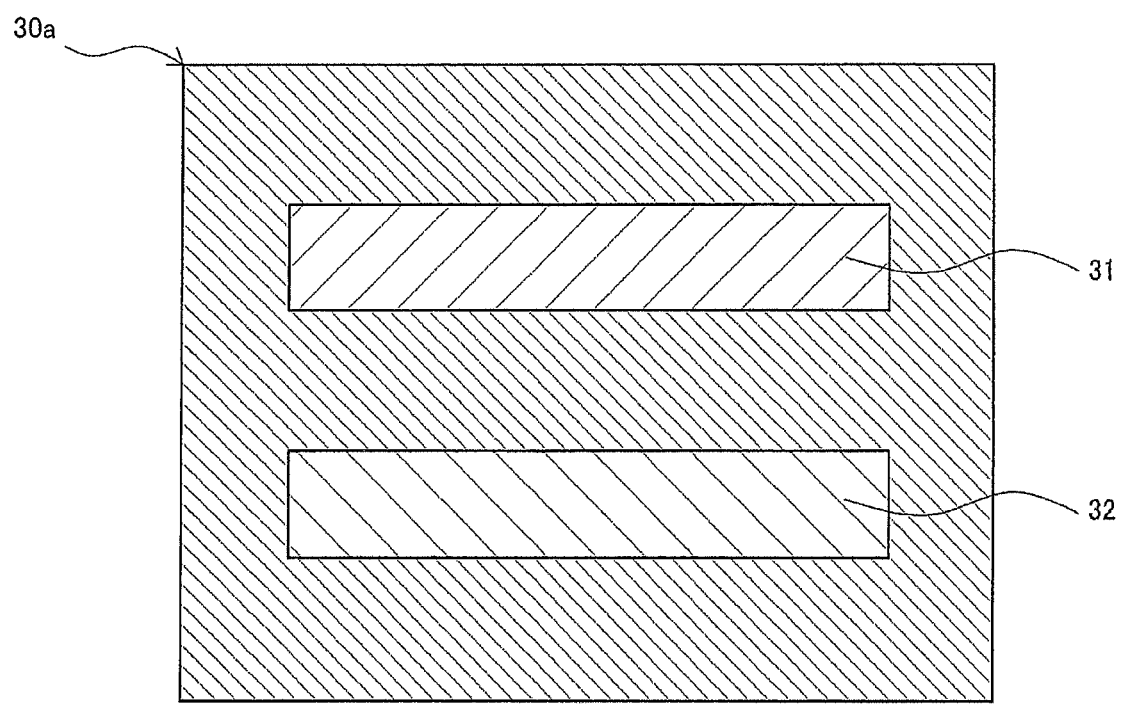
FIG. 2 is a plan view illustrating an example of the arrangement of openings of photomasks which is common to all embodiments of the present invention.

FIG. 1 is a plan view illustrating a basic exposure method common to all embodiments of the present invention. FIG. 2 is a plan view illustrating a basic arrangement of openings of photomasks which is common to all embodiments of the present invention, and is an enlarged view of an A portion of FIG. 1. In FIG. 1, regions indicated by hatching sloping downward to the right are display regions in which colored pixels are arranged, and regions indicated by hatching sloping upward to the right are first non-display regions described later. In the drawings mentioned hereinafter, the direction of a substrate is defined based on an X direction and a Y direction orthogonal to each other for convenience of explanation. Specifically, the X direction is parallel to the oppositely-located long sides of the display regions, and the Y direction is parallel to the oppositely-located short sides of the display regions (the same applies to the drawings mentioned hereinafter).

As shown in FIG. 1, photomasks 30a to 30l are mounted to a plurality of exposure heads, respectively, and are arranged in the X direction in two separate rows. More particularly, the photomasks 30a, 30c, 30e, 30g, 30i, and 30k are arranged at predetermined intervals in the first row (on the side from which a substrate 20 is brought in), and the photomasks 30b, 30d, 30f, 30h, 30j, and 30l are arranged in the second row so as to compensate for the spaces between the photomasks in the first row.

The photomasks 30a to 30l include openings for forming a plurality of colored pixels and a plurality of PSs in display regions 40. In addition, openings for forming a plurality of dummy PSs in first non-display regions 51 described later are provided on the left end of the photomask 30a, on the right end of the photomask 30e, on the left end of the photomask 30f, and in the photomask 30k.

Here, as shown in FIG. 2, arrays of openings 31 and 32 are formed in two separate regions in the photomask 30a (the same is true for the other photomasks 30b to 30l, although not shown). This is in order to enable one photomask to form two types of patterns. The openings are used as follows: the openings 31 are used for exposure when the substrate 20 is transported in the Y direction; and the openings 32 are used for exposure when the substrate 20 is transported in the X direction described later. When the substrate transportation direction is changed between the X and Y directions, the arrays of openings to be used are switched by shifting the photomasks upward or downward such that the array of openings 31 or the array of openings 32 is selectively opposed to a light source.

In the example shown in FIG. 1, eight color filter substrates 10 are formed on the substrate 20. At the time of exposure, as shown in FIG. 1, the Y direction and the transportation direction of the substrate 20 are aligned with each other, and exposure is intermittently carried out a plurality of times while the substrate 20 is being transported at a predetermined speed toward the photomasks 30a to 30l arranged as shown in FIG. 1. Thus, patterning is performed to sequentially form colored pixels and PSs in each display region 40 on the substrate 20, and sequentially form dummy PSs in each pair of regions (hereinafter, referred to as "first non-display regions") 51 that are along the sides of the display region 40 in the Y direction. In this process, regions between the display regions 40 adjacent in the substrate transportation direction are shaded by using blind shutters.

Figure 3:
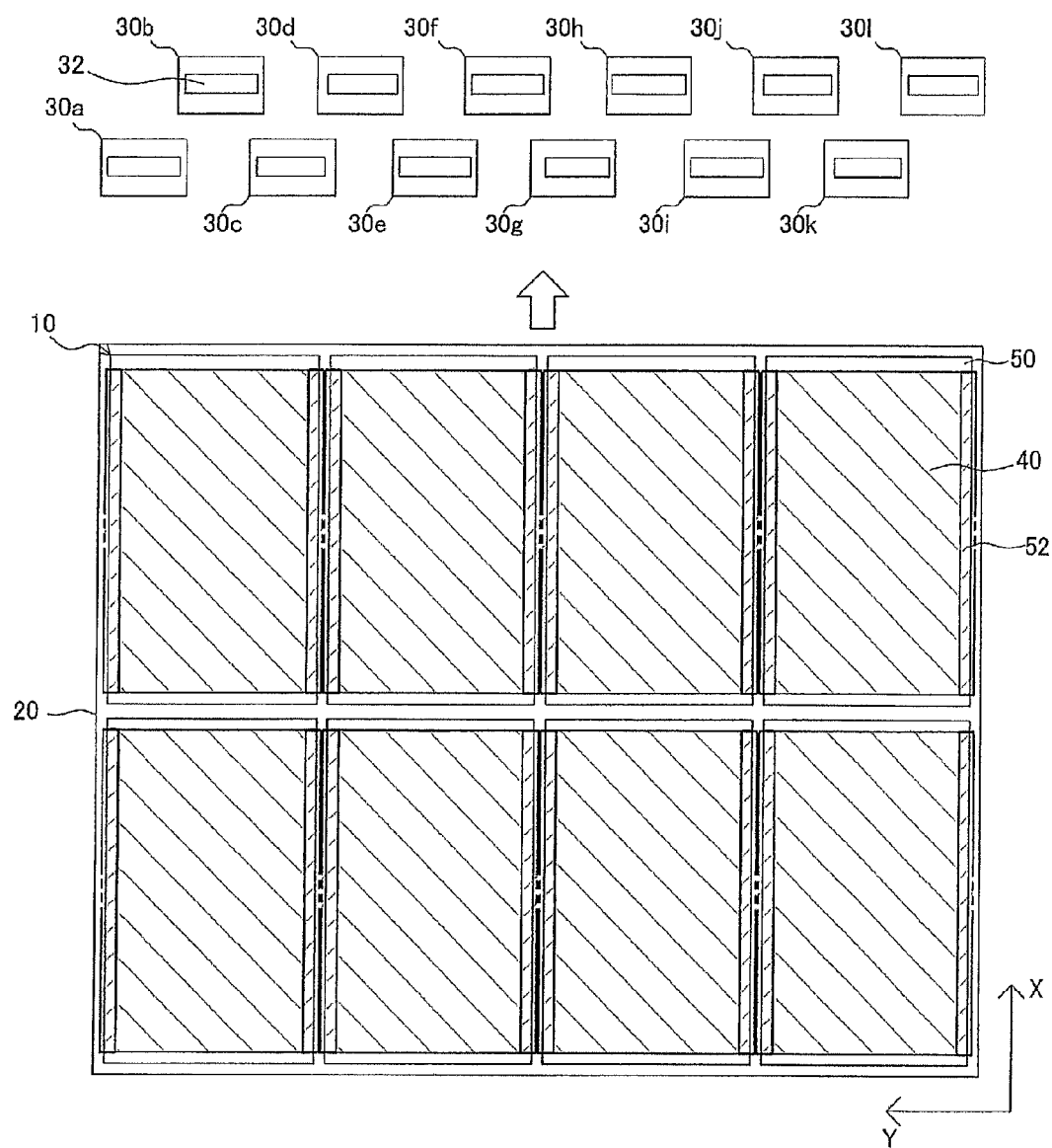
FIG. 3 is a plan view illustrating a basic exposure method common to all embodiments of the present invention.

FIG. 3 is a plan view illustrating a basic exposure method common to all embodiments of the present invention, and illustrates an exposure method performed in combination with the exposure method shown in FIG. 1. In FIG. 3, regions indicated by hatching sloping downward to the right are the display regions, and regions indicated by hatching sloping upward to the right are second non-display regions described later.

After scanning exposure in the Y direction is completed, the substrate 20 whose first non-display regions 51 have been exposed is rotated by 90 degrees from the state shown in FIG. 1, and is thereby positioned as shown in FIG. 3 relative to the photomasks 30a to 30l (the transportation direction of the substrate and the X direction of the substrate are aligned with each other). At the time of the exposure shown in FIG. 3, patterns to be formed by exposure need to be changed in accordance with the orientation of the substrate 20, and for this purpose, the other array of openings 32 (see FIG. 2) provided in each of the photomasks 30a to 30l can be used instead of replacing the photomasks themselves. In addition, the photomasks 30a to 30l include openings for forming a plurality of colored pixels and a plurality of PSs in the display regions 40. Furthermore, openings for forming a plurality of dummy PSs in second non-display regions 52 are provided on the left end of the photomask 30a, the right end of the photomask 30c, the left end of the photomask 30d, the right end of the photomask 30f, the left end of the photomask 30g, the right end of the photomask 30i, the left end of the photomask 30j, and the right end of the photomask 30l.

The X direction and the transportation direction of the substrate 20 are aligned with each other, and exposure is intermittently carried out a plurality of times while the substrate 20 is being transported at a predetermined speed. Thus, patterning is performed to sequentially form colored pixels and PSs in each display region 40 on the substrate 20, and sequentially form dummy PSs in each pair of regions (hereinafter, referred to as "second non-display regions") 52 that are along the sides of the display region 40 in the X direction. In this process, regions between the display regions 40 adjacent in the substrate transportation direction are shaded by using blind shutters.

Colored pixels of the same color and layers of the same color which constitute the PSs in the display regions 40 may be formed by performing scanning exposure once in the X direction or the Y direction, or may be formed by performing scanning exposure two times in the X and Y directions.

Figure 4:
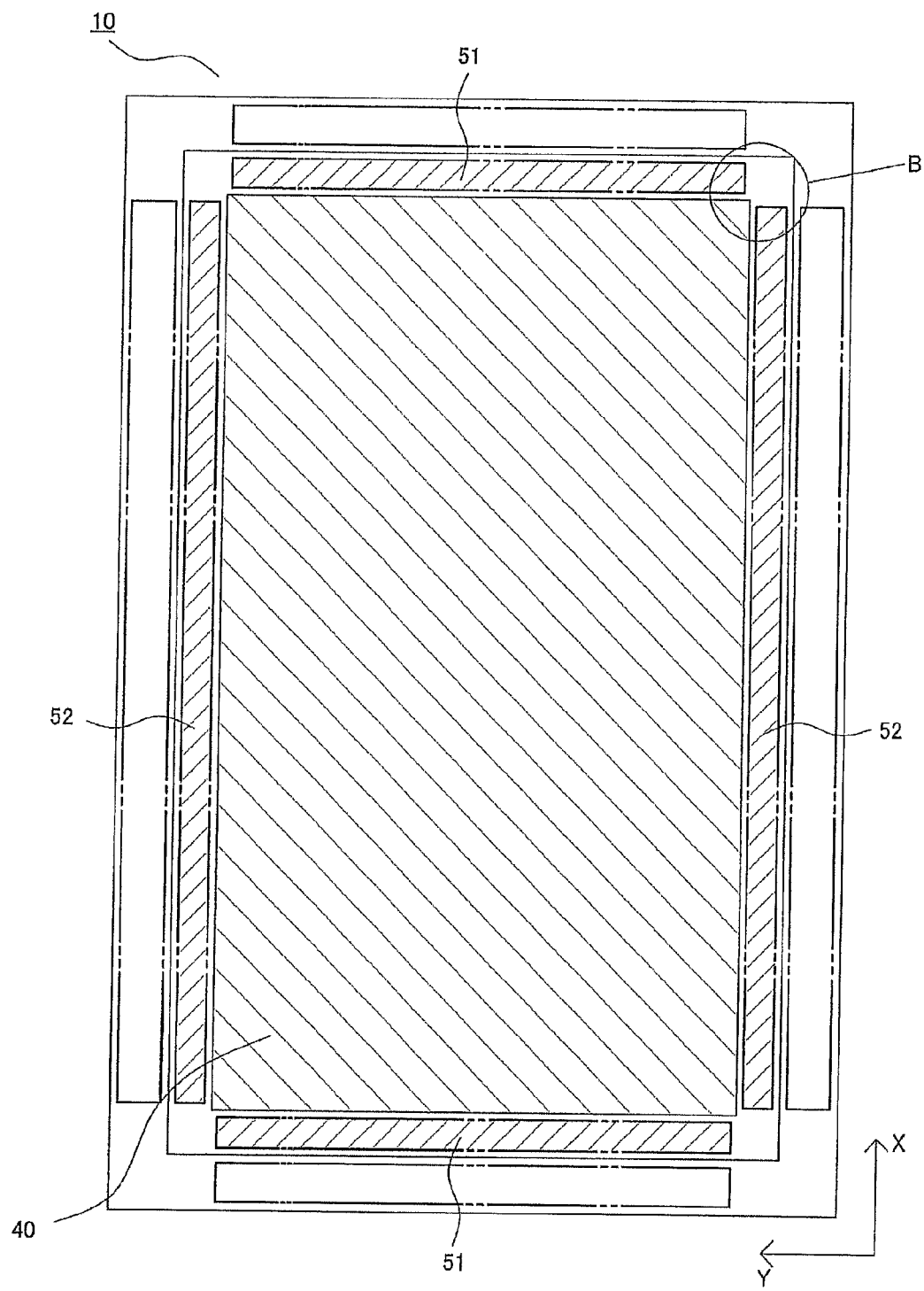
FIG. 4 is a plan view of a color filter common to all embodiments of the present invention.
Figure 5:
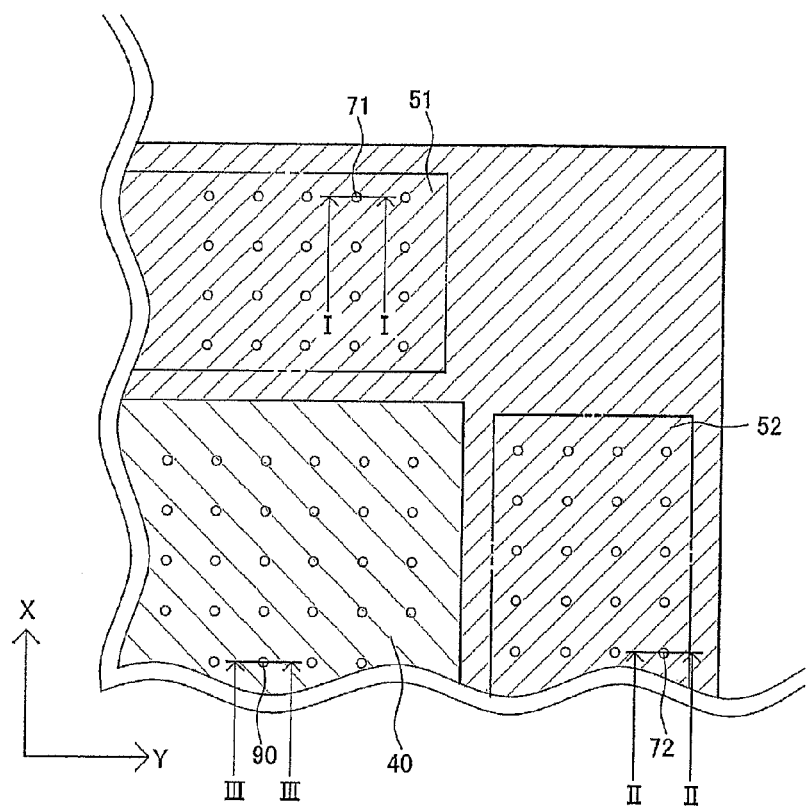
FIG. 5 is an enlarged view of a B portion shown in FIG. 4.

FIG. 4 is a plan view of a color filter substrate formed after exposure, and FIG. 5 is an enlarged view of a B portion of FIG. 4.

The color filter substrate 10 formed after the small mask continuous exposure is performed in the X and Y directions has colored pixels (not shown) and PSs 90 in the display region 40, and has a plurality of dummy PSs 71 in the first non-display regions 51 and a plurality of dummy PSs 72 in the second non-display regions 52.

Hereinafter, exposure methods according to embodiments will be described with reference to FIGS. 6 to 13 and FIG. 5.

First Embodiment

Figure 6:
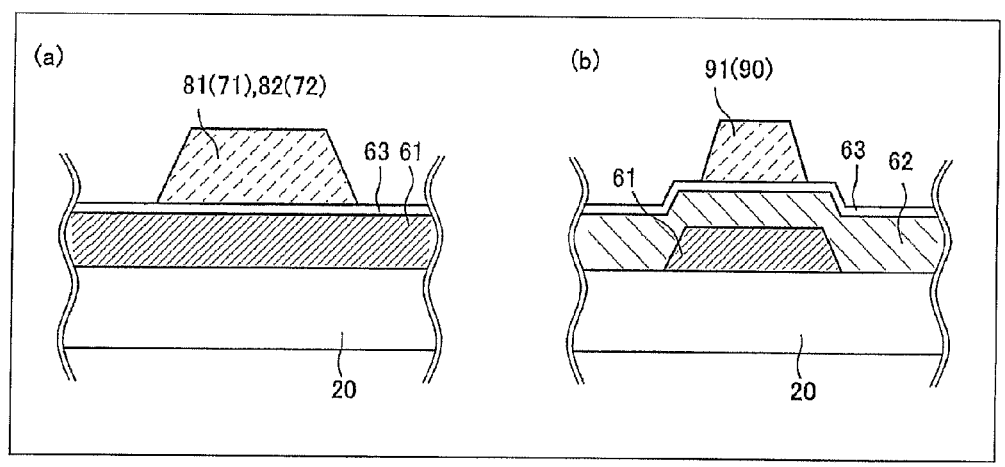
FIG. 6 shows cross-sectional views of a PS and a dummy PS on a color filter substrate according to a first embodiment.

FIG. 6 shows cross-sectional views of portions of a color filter substrate according to a first embodiment. More particularly, (a) corresponds to a cross-sectional view taken along the I-I line or the II-II line of FIG. 5, and (b) corresponds to a cross-sectional view taken along the III-III line of FIG. 5.

As shown in FIG. 6(a), a first layer 81 constituting a dummy PS 71 and a second layer 82 constituting a dummy PS 72 are formed in the first non-display region 51 and the second non-display region 52, respectively, on the substrate 20 on which a black matrix 61 and an ITO film are stacked. As shown in (b), the black matrix 61, a colored layer 62, and the ITO film 63 are stacked in the display region 40 on the substrate 20. Furthermore, a layer 91 constituting a first PS 90 is formed on the ITO film 63 layered over the black matrix 61. In the present embodiment, the first layer 81 and the layer 91 are composed of, for example, an insulating resin different from a material of the colored layer constituting a colored pixel.

Figure 7:
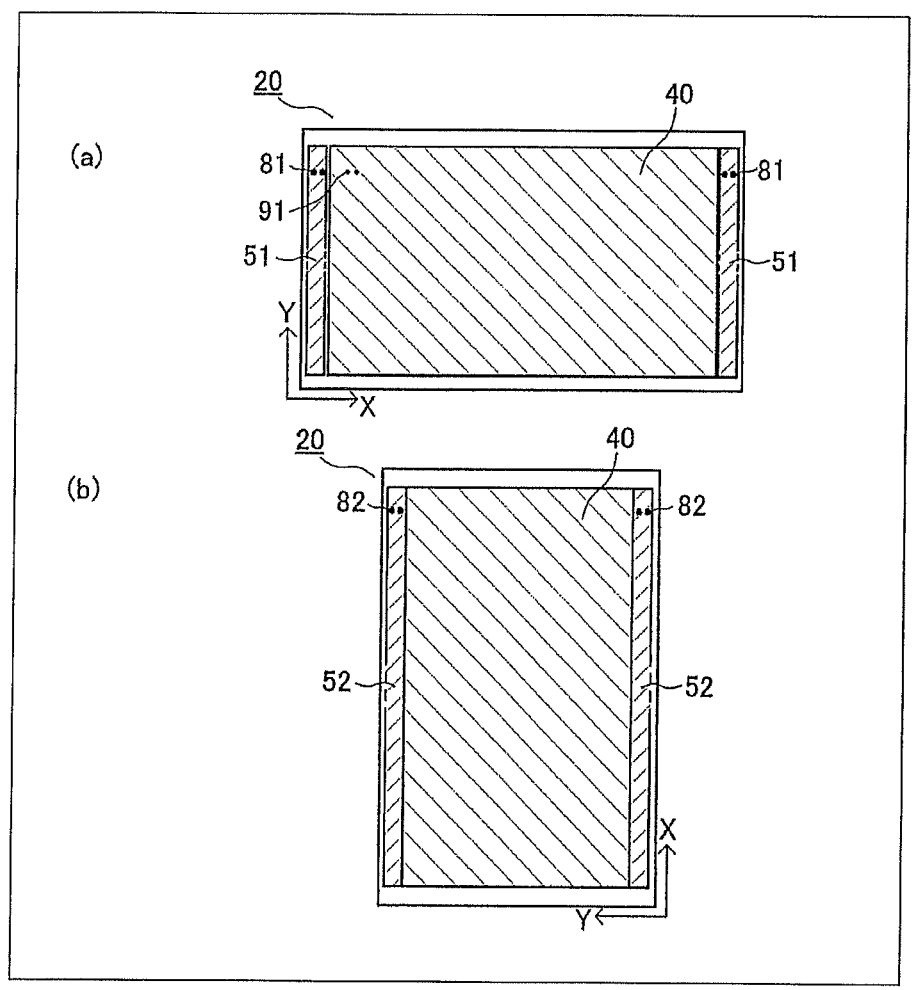
FIG. 7 shows plan views illustrating an exposure method for the color filter substrate according to the first embodiment.

FIG. 7 shows plan views illustrating an exposure method for the color filter substrate according to the first embodiment. Of the entire substrate, only a region that corresponds to a single color filter substrate is shown in order to simplify the explanation. The upward direction in FIG. 7 is the substrate transportation direction.

First, the black matrix 61 and colored layers 62 are formed on the substrate 20 by use of a commonly-known technique, and then the ITO film 63 is formed so as to cover the black matrix 61 and the colored layers 62. Subsequently, a photoresist is applied to the substrate 20.

While the substrate 20 is being transported in the Y direction shown in (a), exposure is performed to form the first layers 81 in the first non-display regions 51 (regions indicated by hatching sloping upward to the right) on the substrate 20, and at the same time to form the layers 91 in the display region 40 (region indicated by hatching sloping downward to the right).

Next, the substrate 20 is rotated by 90 degrees, and exposure is performed while the substrate 20 is being transported in the X direction shown in (b), to form the second layers 82 in the second non-display regions 52 (regions indicated by hatching sloping upward to the right).

As described above, by performing the small mask continuous exposure on the substrate 20 once in the X direction and once in the Y direction, the dummy PSs 71 each consisting of a single layer can be formed in the first non-display regions 51, and the dummy PSs 72 each consisting of a single layer can be formed in the second non-display regions 52, such that the dummy PSs 71 and 72 are arranged with desired pitches and have desired shapes.

Second Embodiment

Figure 8:
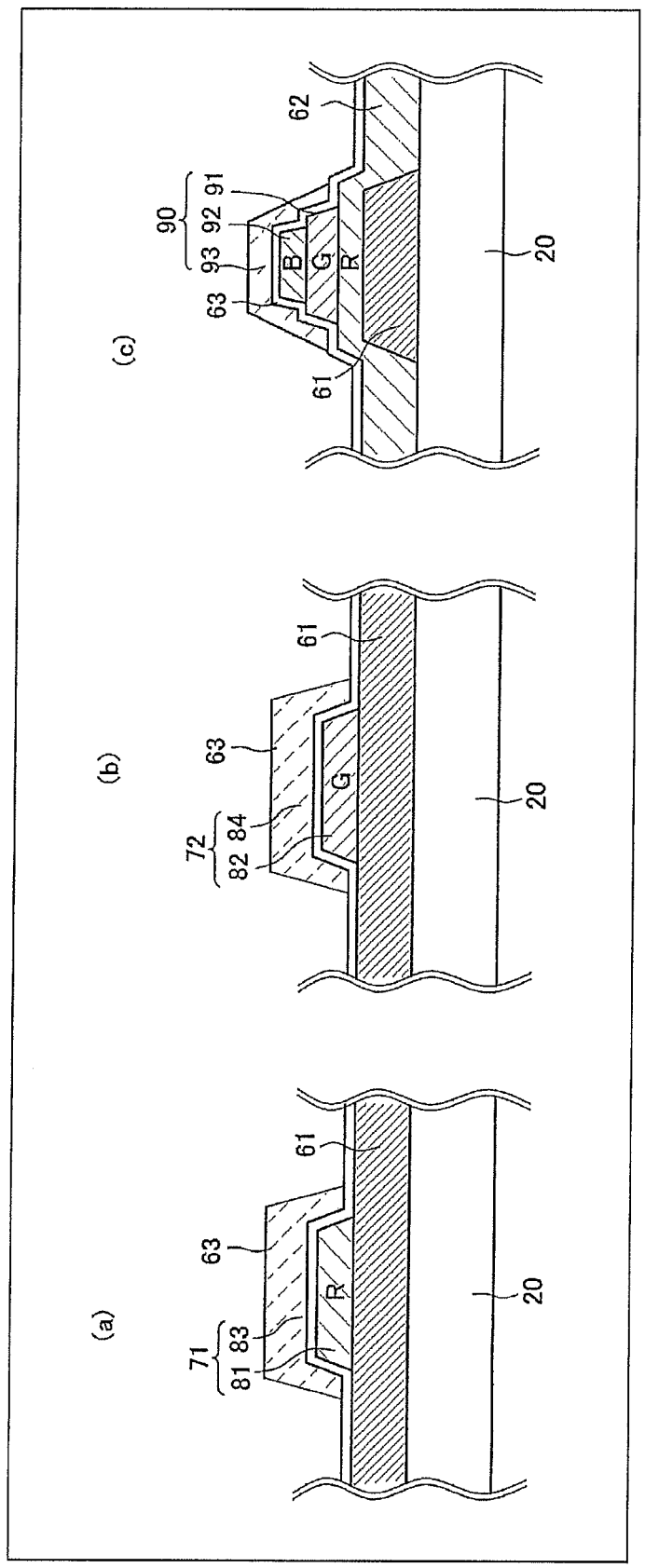
FIG. 8 shows cross-sectional views of a PS and dummy PSs on a color filter substrate according to a second embodiment.

FIG. 8 shows cross-sectional views of a PS and dummy PSs on a color filter substrate according to a second embodiment. More particularly, (a) corresponds to a cross-sectional view taken along the I-I line of FIG. 5, (b) corresponds to a cross-sectional view taken along the II-II line of FIG. 5, and (c) corresponds to a cross-sectional view taken along the III-III line of FIG. 5.

As shown in FIG. 8(a), the first layer 81 and a third layer 83 which constitute the dummy PS 71 are formed in the first non-display region 51 on the substrate 20 on the surface of which the black matrix 61 is formed. As shown in (b), the second layer 82 and a fourth layer 84 which constitute the dummy PS 72 are formed in the second non-display region 52 on the substrate 20 on the surface of which the black matrix 61 is formed. As shown in (c), the black matrix 61 and the colored layer 62 are stacked in the display region 40 on the substrate 20. Layers 91 to 93 constituting a PS 90 are stacked over the colored layer 62 on the black matrix 61. The third layer 83, the fourth layer 84, and the layer 93 are composed of an insulating resin different from a material of the colored layer constituting a colored pixel.

Figure 9:
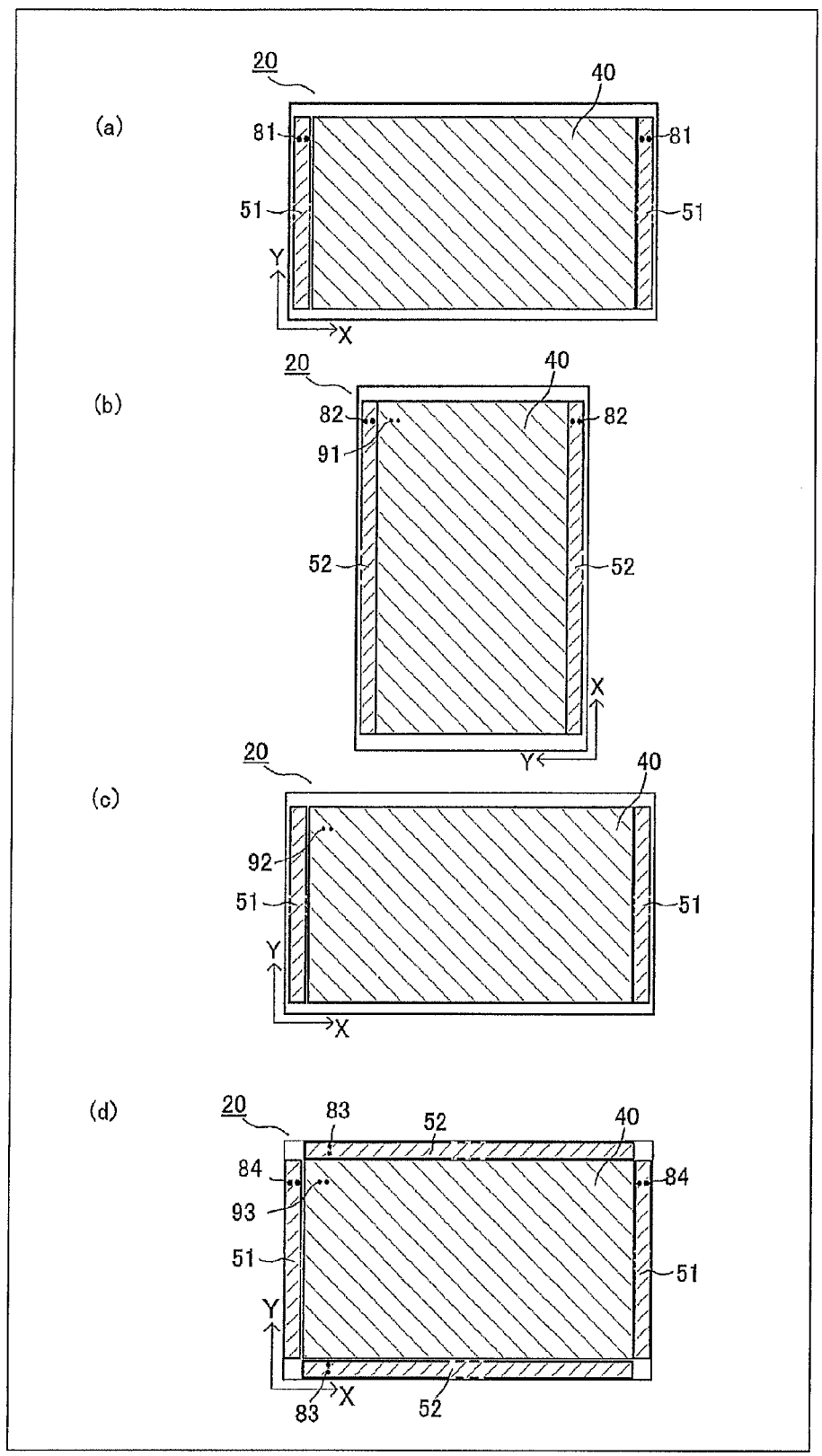
FIG. 9 shows plan views illustrating an exposure method for the color filter substrate according to the second embodiment.
Figure 10:
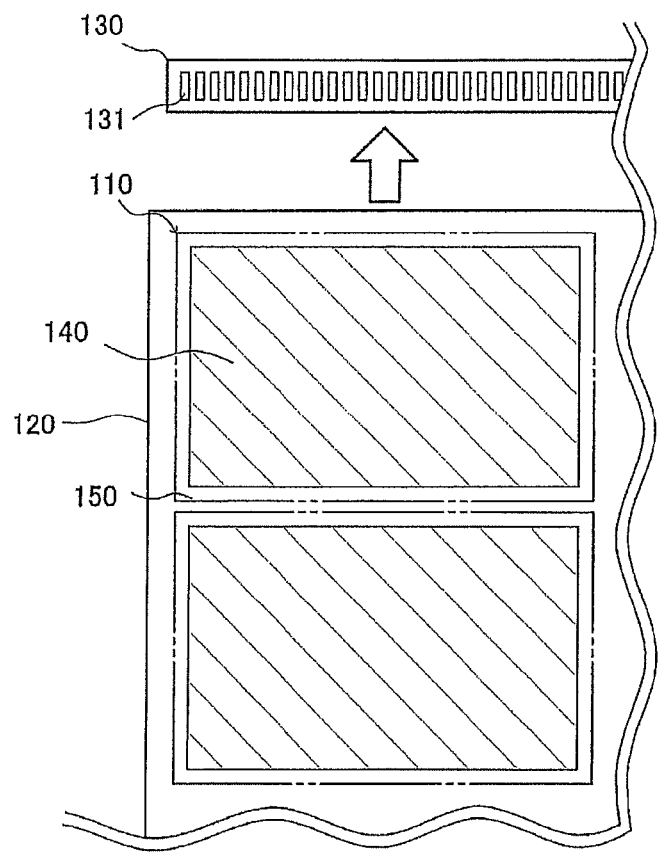
FIG. 10 is a plan view illustrating an exposure method using a small mask continuous exposure mode.
Figure 11:
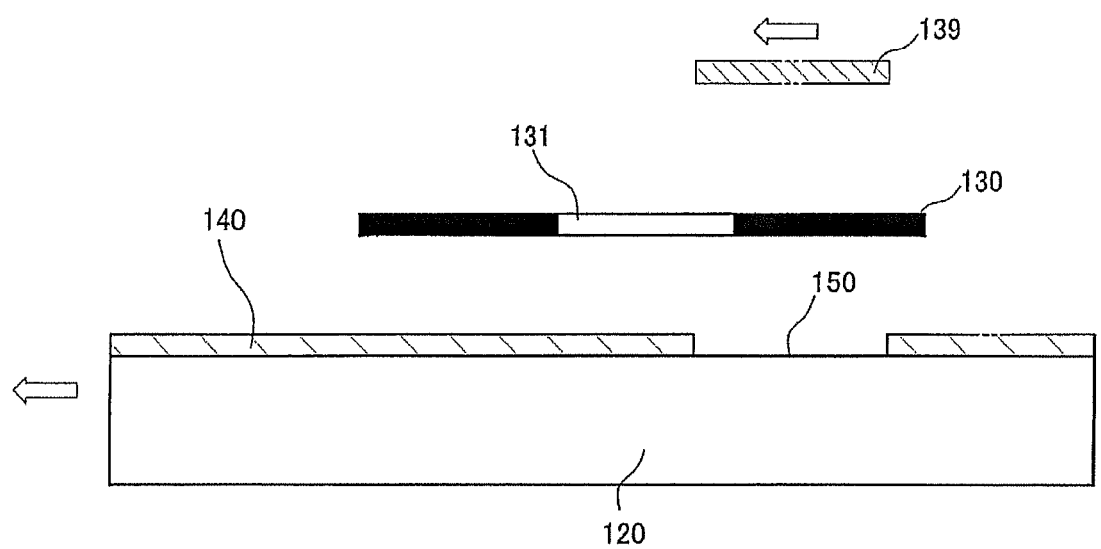
FIG. 11 is a side view illustrating a positional relationship among a substrate, a photomask, and a blind shutter.

FIG. 9 shows plan views illustrating an exposure method for the color filter substrate according to the second embodiment. Also in FIG. 9, the upward direction is the substrate transportation direction.

First, the black matrix 61 is formed on the substrate 20 by use of a commonly-known technique. Subsequently, a red photoresist is applied to the substrate 20, and then the small mask continuous exposure is performed while the substrate 20 is being transported in the Y direction shown in (a), to form red colored layers 62 in the display region 40 and to form the first layers 81 in the first non-display regions 51.

Next, a green photoresist is applied to the substrate 20, and then the small mask continuous exposure is performed while the substrate 20 is being transported in the X direction shown in (b), to form green colored pixels and the layers 91 in the display region 40 and to form the second layers 82 in the second non-display regions 52.

Next, a blue photoresist is applied to the substrate 20, and then the small mask continuous exposure is performed while the substrate 20 is being transported in the Y direction shown in (c), to form blue colored pixels and the layers 92 in the display region 40. In this step, the substrate 20 may be transported in the X direction when the small mask continuous exposure is performed.

Next, the ITO film 63 is formed so as to cover the display region 40, the first non-display regions 51, and the second non-display regions 52.

Finally, a photoresist composed of an insulating resin is applied to the substrate 20, and as shown in (d), exposure is performed once on the substrate 20 to simultaneously form the third layers 83 over the first layers 81 in the first non-display regions 51, the fourth layers 84 over the second layers 82 in the second non-display regions 52, and the layers 93 over the layers 92 in the display region 40. In this step, a single photomask having a size corresponding to the size of a single color filter substrate is used instead of small masks.

As described above, even in the case where sub PSs are formed as layered bodies of one layer composed of the same material as colored pixels of first to third colors and another layer composed of an insulating resin, the first non-display regions, the second non-display regions, and the display region can collectively be exposed. Furthermore, employing the layered structure allows for formation of higher dummy PSs.

In the first embodiment, the substrate is scanned in the specific order of the X direction and then the Y direction. In the second embodiment, the substrate is scanned in the specific order of the X direction, the Y direction, and then the X direction. However, the order of scanning the substrate is not limited to these orders. For example, in the first embodiment, the steps shown in (a) and (b) of FIG. 7 may be performed in the reverse order. Furthermore, in the second embodiment, the steps shown in FIG. 9 may be performed in any of the following orders: (a), (c), (b), and (d); (b), (a), (c), and (d); (b), (c), (a), and (d); (c), (a), (b), and (d); and (c), (b), (a), and (d).

In addition, in the first and second embodiments, PSs are formed in display regions while at the same time dummy PSs are formed in non-display regions. However, the present invention is not limited thereto, and PSs may be formed in another step.

Furthermore, in the second embodiment, the colors of colored layers and the order of formation of the colored layers are particularly specified. However, the colors and the order of formation are not limited to examples described in the second embodiment, and can optionally be specified.

The present invention is applicable to, for example, an exposure method for color filter substrates used for liquid crystal display devices or organic EL.

DESCRIPTION OF THE REFERENCE CHARACTERS

10 color filter substrate
20 substrate
30 photomask
31, 32 array of openings
40 display region
51 first non-display region
52 second non-display region
61 black matrix
62 colored layer
63 ITO film
71, 72 dummy PS
81 first layer
82 second layer
83 third layer
84 fourth layer
90 PS
91 to 93 layer

The invention claimed is:

1. An exposure method for a color filter substrate having: a rectangular display region which has a pair of sides extending in a first direction and a pair of sides extending in a second direction orthogonal to the first direction and in which a plurality of colored pixels and a plurality of photo spacers (PSs) are provided; a pair of first non-display regions which are respectively along the sides extending in the first direction and in which a plurality of dummy photo spacers (dummy PSs) are provided; and a pair of second non-display regions which are respectively along the sides extending in the second direction and in which a plurality of dummy photo spacers (dummy PSs) are provided, the exposure method comprising:

forming a first layer included in a first dummy PS in the first non-display region by applying light, a plurality of times intermittently, on a substrate to which a photoresist has been applied while simultaneously transporting the substrate in the first direction; and forming a second layer included in a second dummy PS in the second non-display region by applying light, a plurality of times intermittently, on the substrate to which the photoresist has been applied while simultaneously transporting the substrate in the second direction, wherein the forming the first layer and the forming the second layer are carried out in an arbitrary order, and the first layer and the second layer are composed of a material different from a material of the colored pixels.

2. An exposure method for a color filter substrate having: a rectangular display region which has a pair of sides extending in a first direction and a pair of sides extending in a second direction orthogonal to the first direction and in which a plurality of colored pixels and a plurality of photo spacers (PSs) are provided; a pair of first non-display regions which are respectively along the sides extending in the first direction and in which a plurality of dummy photo spacers (dummy PS) are provided; and a pair of second non-display regions which are respectively along the sides extending in the second direction and in which a plurality of dummy photo spacers (dummy PS) are provided, the exposure method comprising:

forming a colored pixel of a first color in the display region, and forming, in the first non-display region, a first layer included in a first dummy PS and composed of the same material as the colored pixel of the first color, by intermittently performing exposure a plurality of times on a substrate to which a photoresist of the first color has been applied while transporting the substrate in the first direction;

forming a colored pixel of a second color in the display region, and forming, in the second non-display region, a second layer included in a second dummy PS and composed of the same material as the colored pixel of the second color, by applying light, a plurality of times intermittently, on the substrate to which a photoresist of the second color has been applied while simultaneously transporting the substrate in the second direction;

forming a colored pixel of a third color in the display region by applying light, a plurality of times intermittently, on the substrate to which a photoresist of the third color has been applied while simultaneously transporting the substrate in the first direction or the second direction; and forming a third layer included in the first dummy PS over the first layer in the first non-display region, and forming a fourth layer included in the second dummy PS over the second layer in the second non-display region, by performing exposure once on the substrate to which a photoresist has been applied, wherein the forming the colored pixel of the first color and the first layer, the forming the colored pixel of the second color and the second layer, and the forming the colored pixel of the third color, are carried out in an arbitrary order, and the third and fourth layers are composed of a material different from a material of the colored pixels.

* * * * *